United States Patent
Overall et al.

(10) Patent No.: US 8,294,461 B2
(45) Date of Patent: Oct. 23, 2012

(54) REVERSE CIRCULARLY POLARIZED NON-TISSUE DAMAGING RF IN MRI DETECTION OF COUPLED RF CURRENT PRODUCING OBJECTS IN A BODY

(75) Inventors: William R. Overall, Palo Alto, CA (US); Greig C. Scott, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 765 days.

(21) Appl. No.: 12/354,451

(22) Filed: Jan. 15, 2009

(65) Prior Publication Data

US 2010/0179763 A1    Jul. 15, 2010

(51) Int. Cl.
*G01V 3/00* (2006.01)
*A61B 5/05* (2006.01)

(52) U.S. Cl. ........ 324/309; 324/318; 324/314; 324/313; 324/311; 324/307; 600/410; 600/422

(58) Field of Classification Search .......... 324/300–322; 382/128–131; 600/407–435
See application file for complete search history.

(56) References Cited

U.S. PATENT DOCUMENTS

| | | | | |
|---|---|---|---|---|
| RE23,950 E | * | 2/1955 | Bloch et al. ................... | 324/307 |
| 3,056,080 A | * | 9/1962 | Crandell ....................... | 324/300 |
| 7,649,353 B2 | * | 1/2010 | Feiweier et al. .............. | 324/309 |
| 2006/0252314 A1 | | 11/2006 | Atalar et al. .................. | 439/876 |
| 2009/0309594 A1 | * | 12/2009 | Feiweier et al. .............. | 324/309 |
| 2010/0179763 A1 | * | 7/2010 | Overall et al. .................. | 702/19 |
| 2010/0249572 A1 | * | 9/2010 | Weiss ........................... | 600/410 |
| 2012/0063219 A1 | * | 3/2012 | Klein et al. .................... | 365/171 |

OTHER PUBLICATIONS

Overall et al., "Detecting Unsafe Coupling Using Reversed RF Polarization," ISMRM MR Safety Workshop, Lisbon, 2008.

* cited by examiner

*Primary Examiner* — Melissa Koval
*Assistant Examiner* — Tiffany Fetzner
(74) *Attorney, Agent, or Firm* — Beyer Law Group LLP

(57) ABSTRACT

A method for detecting coupled RF current magnetic resonance (MR) objects in a body and determining MR risk is provided. The body is scanned with reverse circularly polarized RF. MR signals generated by coupling of the reverse circularly polarized RF with the RF current MR objects are detected. The detected MR signals are used to determine a risk value.

17 Claims, 7 Drawing Sheets

REVERSE CIRCULARLY POLARIZED NON-TISSUE DAMAGING RF IN MRI DETECTION OF COUPLED RF CURRENT PRODUCING OBJECTS IN A BODY

GOVERNMENT RIGHTS

The U.S. government has rights in the disclosed invention pursuant to NIH grants to Stanford University including National Institutes of Health: 1R01EB008108-01.

BACKGROUND OF THE INVENTION

This invention relates generally to magnetic resonance imaging (MRI). MRI is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

Patients with many types of common implants, including pacemakers, defibrillators, guide wires, ablation catheters, and neurostimulators, are not eligible for MRI because of the risk of tissue heating due to coupling between the RF excitation and their device. Sometimes patients with dangerous implants are subjected to MRI scans, because the danger is not recognized for various reasons. Such scans may cause injury or death.

SUMMARY OF THE INVENTION

In accordance with the invention, a method for detecting coupled RF current magnetic resonance (MR) objects in a body is provided. The body is scanned with reverse circularly polarized RF. MR signals generated by coupling of the reverse circularly polarized RF with the RF current MR objects are detected.

In another manifestation of the invention, a method for detecting coupled RF current MR objects in a body is provided. MR signals in the body with reversed circularly polarized RF are detected. Intensities of the MR signals are used to determine a risk value.

In another manifestation of the invention, an apparatus for detecting coupled RF current magnetic resonance (MR) objects in a body is provided. A magnetic resonance imaging excitation and detection system is provided. A controller is electrically connected to the magnetic resonance imaging excitation and detection system, comprising a display, at least one processor, and computer readable media. The computer readable media comprises computer readable code for scanning the body with reverse circularly polarized RF, computer readable code for detecting MR signals generated by coupling of the reverse circularly polarized RF with the RF current MR objects, computer readable code for using the detected MR signals to determine a risk value, and computer readable code for providing the risk value to a user.

The invention and objects and features thereof will be more readily apparent from the following detailed description and appended claims when taken with the drawings.

DETAILED DESCRIPTION OF ILLUSTRATED EMBODIMENTS

An embodiment of the invention provides a simple method for detecting RF coupling between RF excitation and an implanted device by transmitting and receiving reverse-polarized RF through an MR device, such as a birdcage resonator or an array of resonators. This produces strong MR signal around any coupled linear structures within the excitation volume and little or no signal everywhere else. Such a technique could be used to safely detect potentially unsafe coupling conditions before tissue damage occurs. A related technique used a reverse-polarized RF receiver for active visualization of catheter microcoils.

Figure 1:
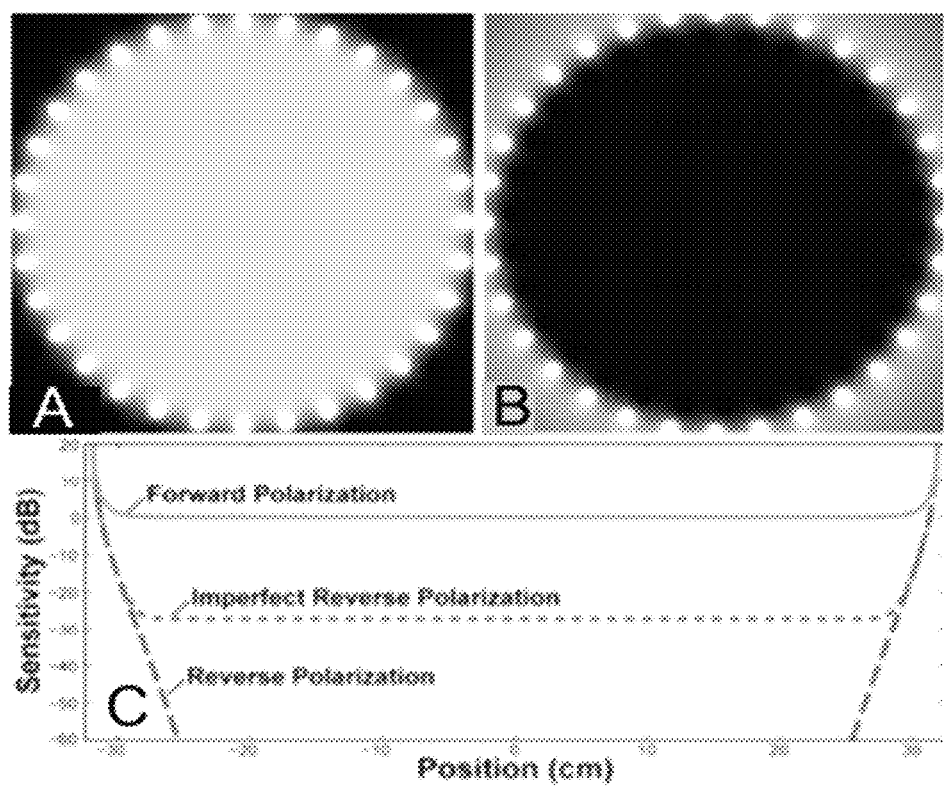
FIG. 1A shows a 32-rung birdcage depicting MRI sensitivity to forward circularly polarized RF.
FIG. 1B shows the 32 rung birdcage depicting MRI sensitivity to reverse circularly polarized RF.
FIG. 1C is a graph of sensitivity versus position for forward circularly polarized RF, perfectly reversed circularly polarized RF, and imperfectly reversed polarized RF.

For efficient MR signal generation and reception, an ideal RF resonator would generate a spatially uniform left circularly polarized field for transmission, $B_L = B_1(a_x + ja_y)/\sqrt{2}$, and a right circularly polarized field for signal reception, $B_R = B_1(a_x - ja_y)/\sqrt{2}$. Here, $a_x$ and $a_y$ represent unit phasors in the x and y directions, and a time dependence of $\exp(j\omega t)$ is assumed. The main magnetic field, Bo, is along the +z axis, so that the direction of hydrogen spin precession would be the same direction as the left circularly polarized field. In MRI, one must transmit an RF field that rotates in the same direction as precession to excite spins. However, to receive a signal, the field pattern must be capable of creating a field that rotates opposite to the direction of precession. FIG. 1A shows that a 32-rung birdcage closely approximates this ideal case in a plane through its center. If this RF polarization is reversed; i.e., $B_R$ is used for transmission and $B_L$ is used for reception, then MR signal is neither generated nor received. The 32-rung birdcage again produces a fine approximation of this condition when its quadrature channels are physically reversed, as shown in FIG. 1B.

FIG. 1C is a graph of sensitivity versus position for forward circularly polarized RF, perfectly reversed circularly polarized RF, and imperfectly reversed polarized RF within a birdcage resonator. Perfectly reversed polarization has zero signal sensitivity over the entire sensitive region of the birdcage. In practice, some imperfections in reversed polarization may remain; however, imperfect reversed polarization of as much as 10 degrees from quadrature still provides over 20 dB of rejection for unwanted signal. Therefore, imperfectly reversed circularly polarized RF can still be a valuable tool for assessing risk.

When an axial linear conductor couples to this birdcage, it generates an additional linearly polarized field, $B_W = \mu_0 I e^{j\phi}(a_y \cos\theta - a_x \sin\theta)/2\pi r$. Here, I is the current induced by transmit coupling, $\phi$ is a temporal phase, and $(r,\theta)$ is the polar position relative to the wire. Wire coupling (and therefore wire current) should be similar regardless of whether the excitation field is forward or reverse-polarized. Thus, a wire in a reverse-polarized birdcage produces signal proportional to its coupling, while the birdcage field alone generates little or no signal. By reversing both the transmit and receive field, the selectivity is squared. If an exact correspondence between measured signal and potentially harmful excitation currents is needed, then the left-circularly polarized mode can be used for both transmission and reception (i.e., forward-polarized transmission and reverse-polarized reception). Because the received sensitivity is proportional to the same left-circularly polarized mode as the imaging excitation field, it will be sensitive to the exact dangerous currents that may be induced during imaging.

Imperfections in the reverse circular polarization may arise from asymmetric loading of the RF coil by the patient. For example, if the body part being imaged has a significantly larger cross-sectional area in one dimension than another, then the coil will tend to be more heavily loaded in the direction of the larger cross-sectional area. This results in lower RF field along that direction, and may also affect the relative phases of the quadrature RF components. To counteract this loading effect, the amplitudes and phases of the quadrature RF transmitter and receiver elements can be individually tuned to the patient, thereby restoring the balanced excitation amplitude and quadrature phase characteristics required for ideal reverse circular polarization. This loading may be detected through use of standard B1 mapping techniques, or may alternatively be detected by RF current sensors placed on or near the rung elements of the RF coil. By sensing the individual B1 fields generated by the RF coil, appropriate compensation may be applied before imaging.

An embodiment of the invention performed simulations to determine the minimum current levels detectable by the technique and to analyze the effects of birdcage imperfections on data quality. Phantom experiments were performed on a 1.5 T GE Signa Excite scanner where the body coil transmit and receive was modified to be switchable between forward and reverse polarization modes. Gradient-echo images were acquired with both forward and reverse polarization and TR=17 ms, TE=7 ms, 45° tip, 28-cm FOV, and a 1-cm slice. A 160-cm guide wire was placed in a doped water phantom near isocenter.

Figure 2:
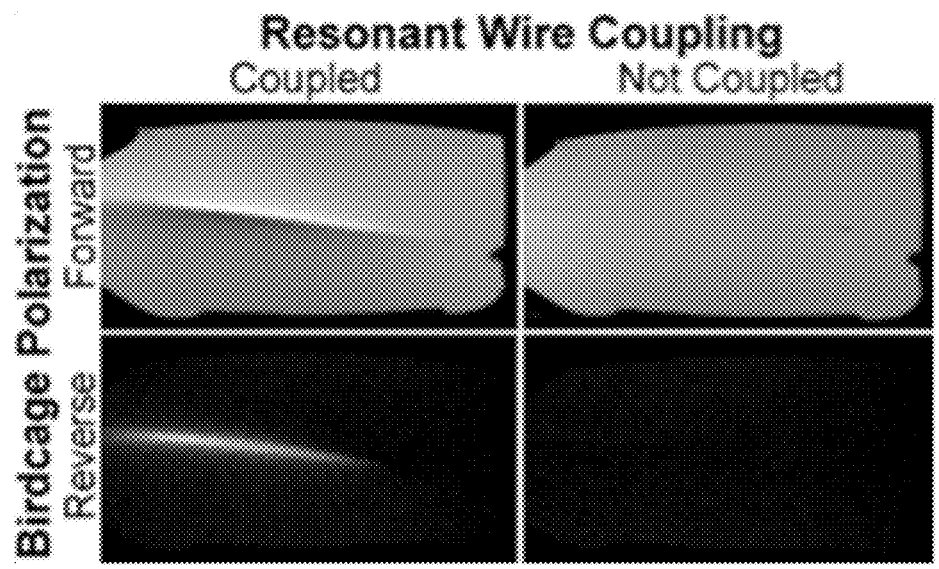
FIG. 2 shows sagittal images of uncoupled and coupled wires with forward or reverse polarization.
Figure 3:
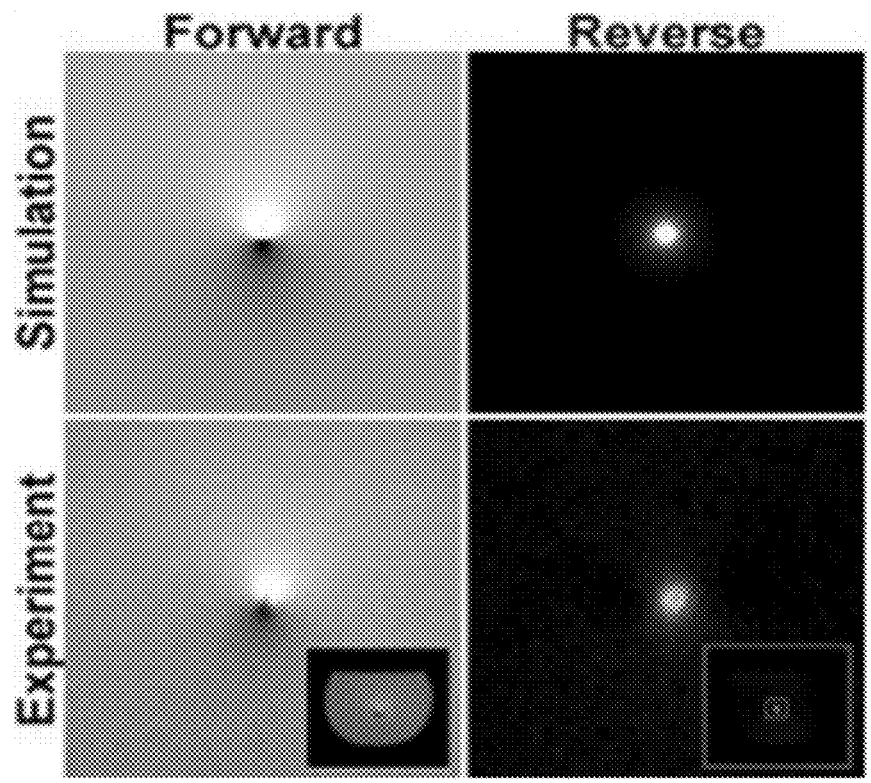
FIG. 3 shows simulations of axial wire currents and the corresponding experimental data using forward or reversed polarization scanning.

Results: FIG. 2 shows sagittal images of the coupled wire, which show significant tip errors near the device in the forward-polarization image and strong near-wire signal in the reverse polarization image, indicating significant coupling. When the wire was cut short to prevent coupling, the reverse-polarization signal vanished. By comparing background sensitivities from these images, it is estimated that the equivalent of a 5-10° quadrature phase imbalance was present for a coil under this load. FIG. 3 shows the simulations of axial wire currents, which closely agree with experiment, and indicates that $I_{peak}$~100 mA was present in the wire at this axial location. Further simulations predict that axial currents below 10 mA can be reliably detected using this technique, below which level RF burns are unlikely.

Discussion: This embodiment demonstrated a new technique for rapidly detecting the presence of dangerous B1 coupling using reversed circular polarization. Moderate imperfections in the birdcage quadrature can be tolerated without diminishing the desired signal. For fixed implants, such a technique could be integrated into a pre-scan regimen, or reverse-polarization echoes may be acquired periodically during scanning to monitor dynamic conditions during interventions. If desired, the tip profile generated by the wire might also be fitted to more accurately quantify wire current from reverse-polarization images.

Generalized Process

Figure 4:
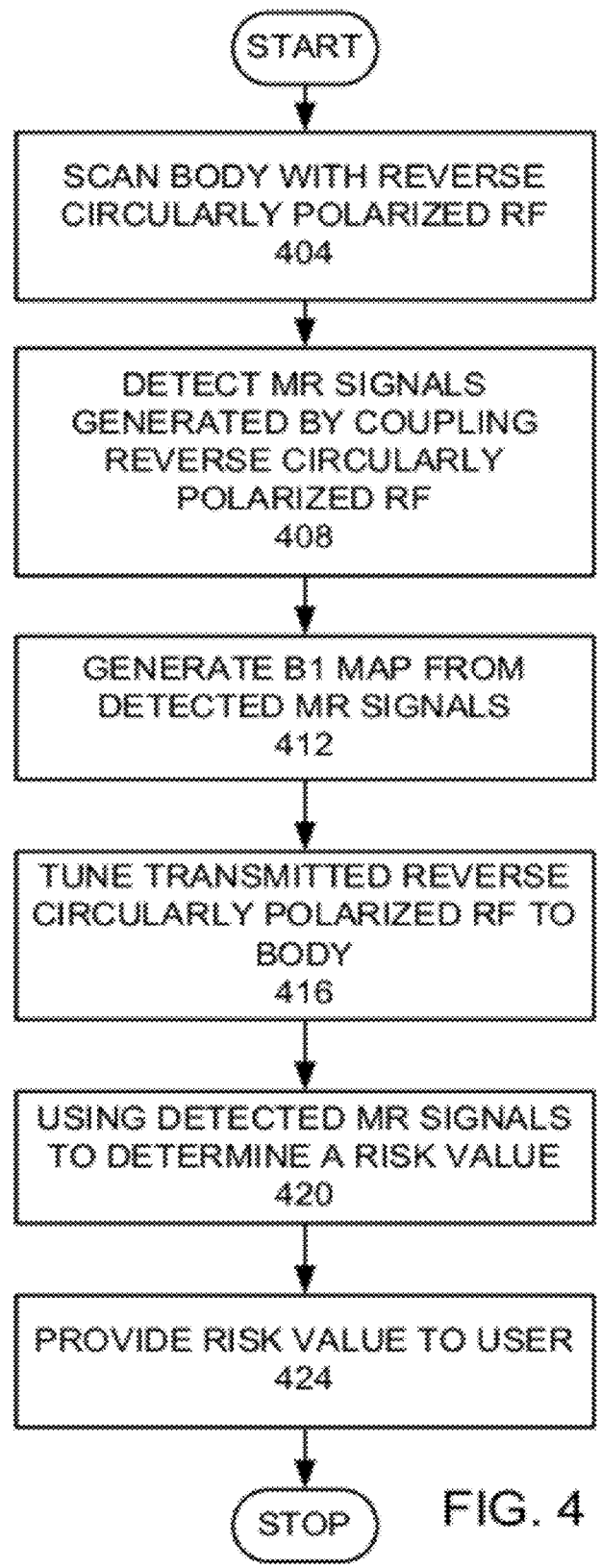
FIG. 4 is a high level flow chart of an embodiment of the invention.

To facilitate understanding, FIG. 4 is a high level flow chart of an embodiment of the invention. A body is scanned with reverse circularly polarized RF (step 404). During conventional MRI a forward circularly polarized RF, which rotates in the same direction as spin precession (left circular polarization for hydrogen), is a transmit RF that generates a magnetic resonance (MR) signal. A perfect reverse circularly polarized transmit RF, which rotates opposite precession (right circularly polarized, is a transmit RF that does not generate a MR signal. A reverse circularly polarized RF is approximately a perfect reverse circularly polarized RF, which generates little or no MR signal, such as the imperfect reverse polarization shown in FIG. 1C. MR signals generated by coupling the reverse circularly polarized RF with the coupled RF current MR objects are detected (step 408). Coupled RF current magnetic resonance (MR) objects are objects that inductively or capacitively couple with RF excitation. Preferably, MR signals are detected by received reverse circularly polarized RF signals. Received reverse circularly polarized RF signals are generally signals generated by a coupled RF current MR object that are detected by a reversed circularly polarized RF receiver. In this example, the reverse received circularly polarized signals are left circularly polarized received RF signals. Optionally, these detected MR signals may be used to generate a $B_1$ map (step 412), which can be used to determine the loading interaction between the RF transmitter and the body. Under this option the transmitted reverse circularly polarized RF is then tuned to the body (step 416) using the detected MR signals, so that a near perfect reversed circularly polarized RF for the body can be provided. The detected MR signals are then used to determine a risk value (step 420). Risk values may be numerical values on a risk scale or may be labels such as "low risk," "moderate risk," and "high risk." The risk value may be determined by the intensity of the detected MR signals or by other characteristics derived from the detected MR signals such as induced RF current. Preferably, the square root of intensity is used to determine risk values in this embodiment. The risk value is provided to the user (step 424). This may be done by displaying the risk factor on a display or printing out the risk factor. An image may also be displayed or printed out that shows objects that provide risk factors, such as the "reverse" images shown in FIG. 2 and FIG. 3.

Figure 5:
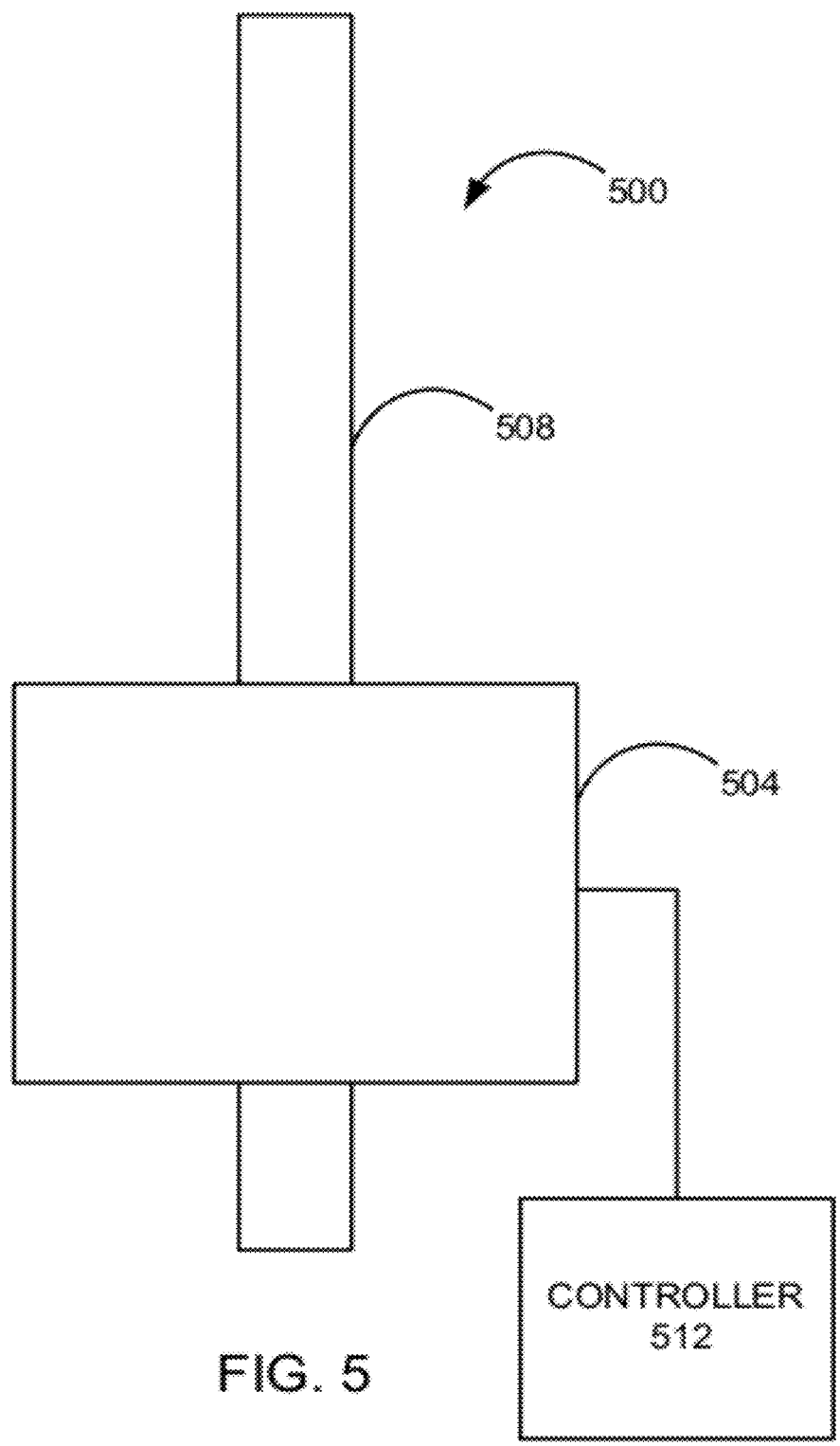
FIG. 5 is a schematic top view of a magnetic resonance imaging (MRI) system that may be used in an embodiment of the invention.

FIG. 5 is a schematic top view of a magnetic resonance imaging (MRI) system 500 that may be used in an embodiment of the invention. The MRI system 500 comprises a magnet system 504, a patient transport table 508 connected to the magnet system, and a controller 512 controllably connected to the magnet system. In one example, a patient would lie on the patient transport table 508 and the magnet system 504 would pass around the patient. The controller 512 would control magnetic fields and radio frequency (RF) signals provided by the magnet system 504 and would receive signals from detectors in the magnet system 504. The controller 512 would have special switching that could provide reverse circularly polarized RF when the switch is in a first position and forward circularly polarized RF when the switch is in a second position. More generally, for arrays of transmitter or receiver resonators, the controller would coordinate the applied amplitude and phase weightings to best synthesize forward or reverse polarization, and would provide appropriate complex weightings to receive elements to synthesize forward or reverse polarized reception.

Figure 6A:
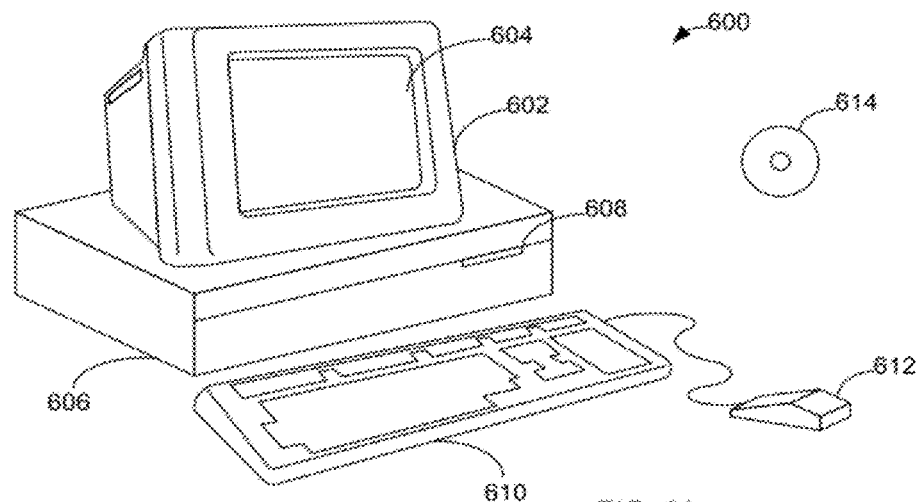
FIGS. 6A and 6B illustrate a computer system that may be used in an embodiment of the invention.
Figure 6B:
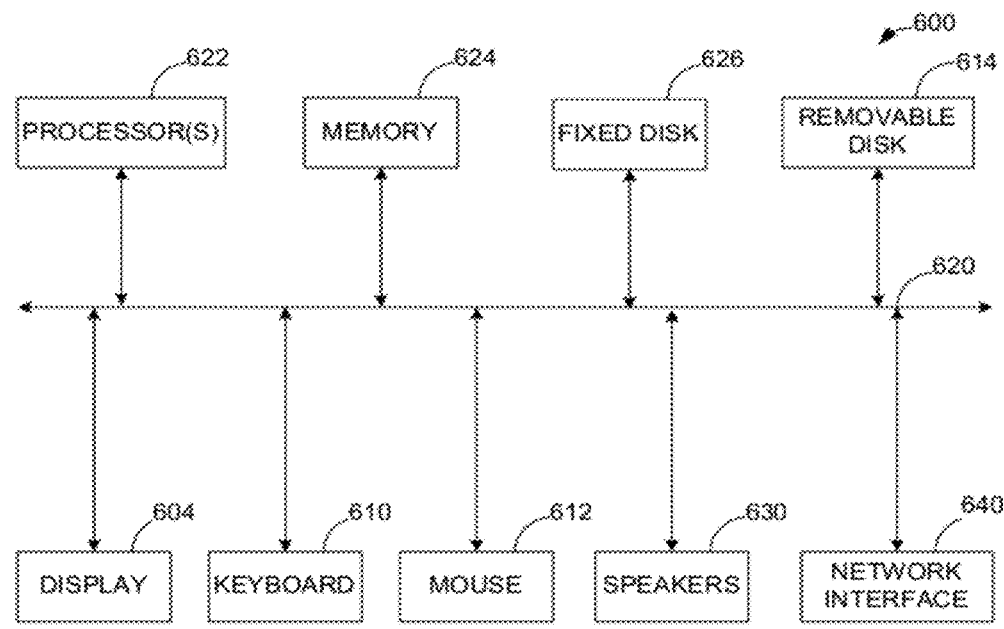

FIGS. 6A and 6B illustrate a computer system 600, which is suitable for implementing a controller 512 used in embodiments of the present invention. FIG. 6A shows one possible physical form of the computer system. Of course, the computer system may have many physical forms ranging from an integrated circuit, a printed circuit board, and a small handheld device up to a huge super computer. Computer system 600 includes a monitor 602, a display 604, a housing 606, a disk drive 608, a keyboard 610, and a mouse 612. Disk 614 is a computer-readable medium used to transfer data to and from computer system 600.

FIG. 6B is an example of a block diagram for computer system 600. Attached to system bus 620 are a wide variety of subsystems. Processor(s) 622 (also referred to as central processing units, or CPUs) are coupled to storage devices, including memory 624. Memory 624 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 626 is also coupled bi-directionally to CPU 622; it provides additional data storage capacity and may also include any of the computer-readable media described below. Fixed disk 626 may be used to store programs, data, and the like and is typically a secondary storage medium (such as a hard disk) that is slower than primary storage. It will be appreciated that the information retained within fixed disk 626 may, in appropriate cases, be incorporated in standard fashion as virtual memory in memory 624. Removable disk 614 may take the form of the computer-readable media described below.

CPU 622 is also coupled to a variety of input/output devices, such as display 604, keyboard 610, mouse 612, and speakers 630. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, printers or other computers. CPU 622 optionally may be coupled to another computer or telecommunications network using network interface 640. With such a network interface, it is contemplated that the CPU might receive information from the network, or might output information to the network in the course of performing the above-described method steps. Furthermore, method embodiments of the present invention may execute solely upon CPU 622 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this example, the controller 512 may be used to generate and then display an image on the display 604. The image may provide risk values. In the alternative, the risk values and/or image may be printed by a printer connected to or forming part of the controller.

Figure 7A:
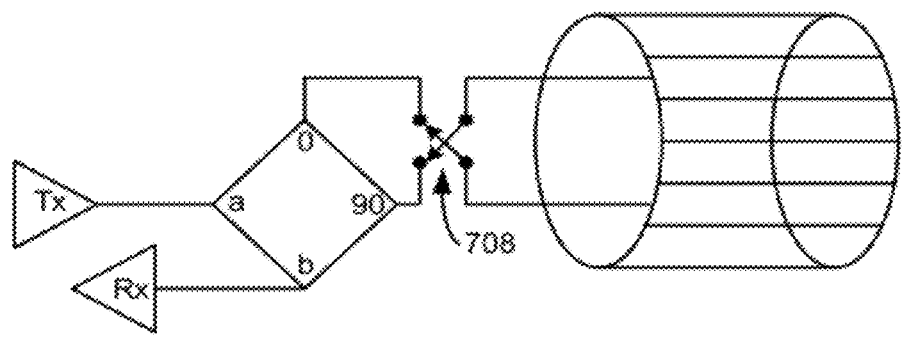
FIGS. 7A and 7B are schematics of the RF transmitter and receiver systems that can create forward and reversed polarization.
Figure 7B:
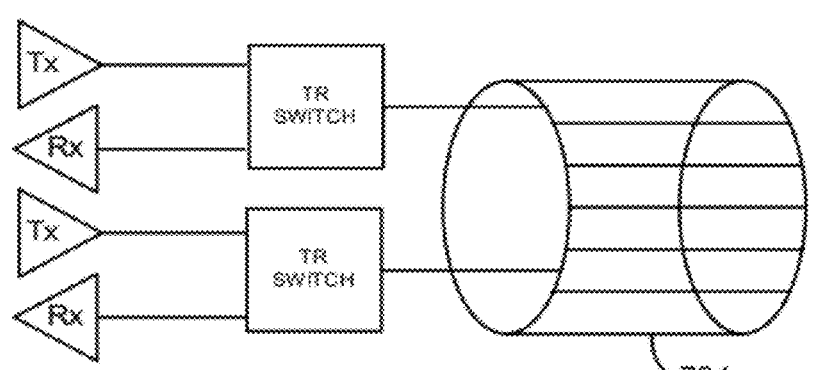

FIGS. 7A-B illustrate various embodiments for a reverse polarizable RF system in MRI. In FIG. 7A, a quadrature birdcage 704 or TEM resonator can be converted to perform forward or reverse polarization by the addition of a double pole double throw (DPDT) switch 708, which can swap the transmit and receive ports. This switch can be a power coaxial magnetically actuated relay, or it can be an arrangement of PIN diodes that steer power and signal when the appropriate electronic bias currents are applied. Quadrature birdcages typically include a quadrature hybrid power combiner/splitter which creates an approximate +/−90 degree phase shift into one port relative to the other to perform forward polarization during both transmit and receive. Only a single transmit amplifier and a single receiver preamplifier are connected and the hybrid provides isolation between the power amplifier and receiver. Reversal of the connections before or after this hybrid creates a reverse polarized RF field. In this configuration, magnetization is neither excited during transmit, and negligible signal is detected during receive. In FIG. 7B, one can retain the birdcage or TEM resonator 704 but remove the quadrature hybrid, and replace the birdcage, or TEM coil with two power transmitters and two receive preamplifiers located spatially 90 degrees around the coil. Now the RF transmit amplitude and phase, and receiver amplitude and phase weightings can be precisely controlled to create forward or reverse polarization. A balanced 4 port drive is a simple extension of this. In the most general case, every port of a birdcage, TEM or any other type of array can be activated with its own power amplifier and signal detected by individual preamplifiers. Each channel's individual transmit amplitude and phase, and receive amplitude and phase can now be precisely controlled to create forward or reverse polarization. The controller 512 could simply actuate the DPDT switch or coordinate the relative amplitude and phase weightings when multiple transmitter amplifiers and receiver preamplifiers are present. During transmit, channel amplitude and phase control could be implemented by direct digital synthesizer, vector modulator, RF attenuators and RF phase shift networks. For receive, amplitude and phase weightings are numerically computed. The controller would also process coil current transducer signals, or directional power sensors as a form of feedback to determine the best amplitude and phase weightings to generate forward and reverse polarization.

Figure 8:
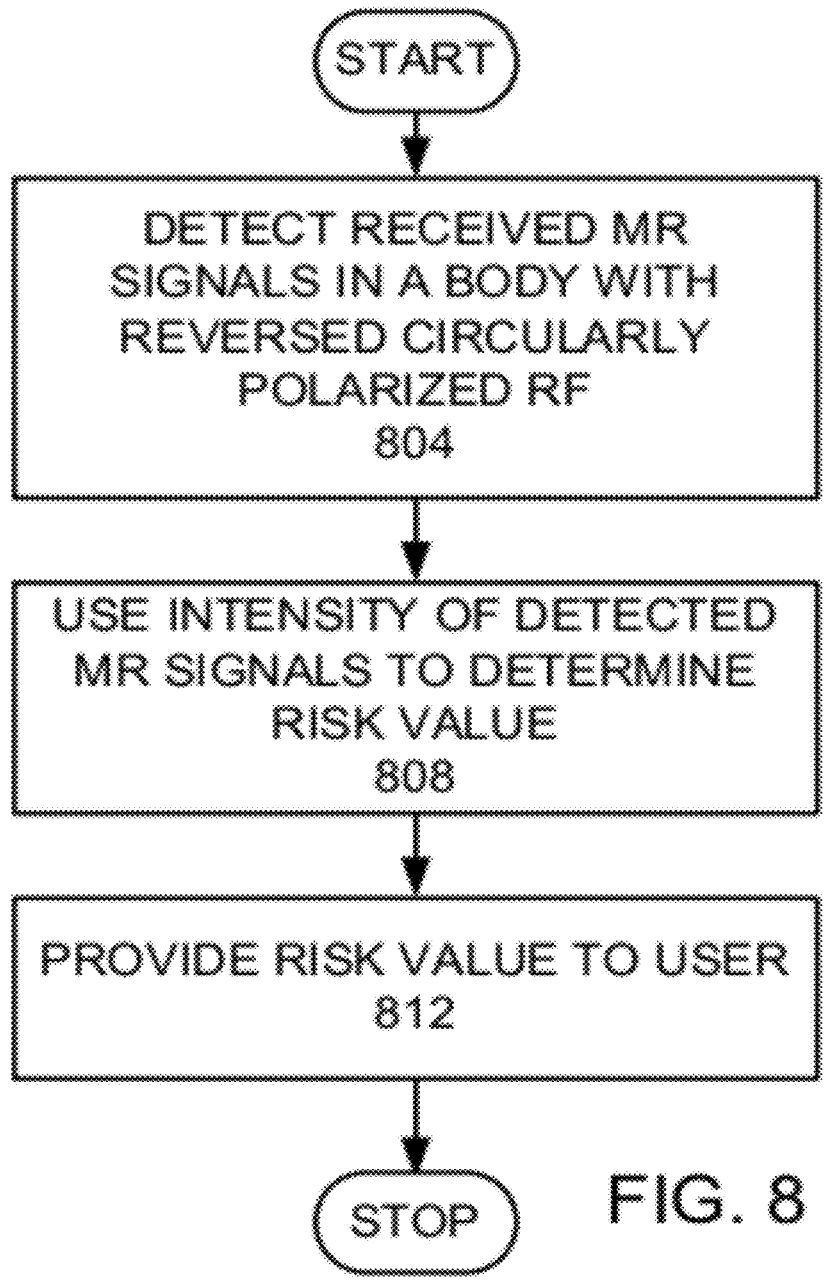
FIG. 8 is a high level flow chart of another embodiment of the invention.

FIG. 8 is a high level flow chart of another embodiment of the invention. In this embodiment received MR signals in a body with reversed circularly polarized RF are detected (step 804). Generally, these reversed circularly polarized RF receive signals are left circularly polarized RF signals. During normal MRI processes the received signals are forward circularly polarized RF, which are right circularly polarized received signals. Coupling with RF current MR objects results in a secondary, substantially linearly polarized RF field, which consists of both forward and reversed circularly polarized components. As a result, the coupled receiver is sensitive to the forward polarized component of the coupled field. The intensity of the detected coupled RF is used to determine risk value (step 808). As mentioned in the previous embodiment, the risk values may be a numerical value or a label. The risk value is provided to the user (step 812).

If risk values of "low risk," "moderate risk," and "high risk" are used, then for a "low risk" the patient may be scanned normally, a "moderate risk" may allow a low RF power scan only, and a "high risk" may prohibit any MR scanning.

Because reversed circularly polarized RF is used by the invention, there is reduced background signal from normal tissues and enhanced signal from potentially hazardous objects, allowing for increased conspicuity of potentially hazardous objects. Background signals are reduced because non-RF coupling objects do not produce MRI signals when excited by reversed circularly polarized RF, nor are reversed circularly polarized RF receivers sensitive to any MR signals if they were present. In addition, the reduction in background signals allows for larger volumes to be scanned in a single pass. For example, in one embodiment a scanning volume may be greater than 20 cm thick. Such a large scan volume allows a quicker prescan.

The ability to quickly scan large volumes also enables rapid quantification of derived physical quantities. For example, to decide the level of risk, further computations from image projections can be combined to estimate the induced RF current, which, combined with knowledge of the implant, could in turn determine potential for heating. MRI RF magnetic field mapping sequences, combined with reverse polarization, would form the basis of these derived physical quantities. The reduction of background signal potentially simplifies image processing and improves accuracy of the derived physical safety measurements.

RF coupling is dependent on the wavelength of the RF signal and the length of the conductive path of the RF coupling object and the magnetic field. Although the coupling mechanism can be quite complex in general, when the length of the conductive path is sufficiently long and the magnetic field sufficiently strong, RF coupling results. So a 50 cm wire in a 1.5 T field would have a strong potential for RF coupling.

Generally, some MRI devices are hardwired to only provide a circularly forward polarized RF excitation. Therefore, one embodiment of the invention would provide hardware to allow switching to provide a circularly reverse polarized RF signal. Another embodiment would provide independent control of the quadrature inputs to the RF coil, thereby allowing tuning of the circular polarization on a per-scan basis.

Such tuning would account for asymmetric construction and/or loading of the quadrature channels, and would correct imbalances in the magnitude, phase, and group delay of each channel, or some mathematically similar transformation. Preferably, the circularly reverse polarized RF excitation signal is no more than 20% from perfectly reverse polarized RF excitation in amplitude, phase, and group delay of the quadrature excitation. More preferably, the circularly reverse polarized RF excitation signal is no more than 10% from perfectly reverse polarized RF excitation. Most preferably, the circularly reverse polarized RF excitation signal is no more than 5% from perfectly reverse polarized RF excitation.

Post-processing of the acquired images may be performed to transform the reversed-polarized images into one or more risk values appropriate for assessing the relative danger to the patient. Such post-processing may include magnitude averaging, peak detection, or fitting the acquired data to a numerical model that simulates MR signal arising from current in a wire. This fitting process could be used to determine the magnitude of current present in the wire at the time of the reversed-polarized scan. Using the bioheat equation and other standard models, the fitted parameters could then be extrapolated to determine local heating, SAR, and/or current magnitudes that would be present during any potential diagnostic scans.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. An apparatus configured for detecting electromagnetically coupled RF current producing objects in a body undergoing a magnetic resonance (MR) imaging prescan, as a prudent safety measure before performing a full MRI imaging scan comprising:
   a magnetic resonance imaging excitation and detection system; and
   a controller electrically connected to the magnetic resonance imaging excitation and detection system, comprising:
      a display;
      at least one processor; and
      non-transitory computer readable media code, that when implemented by the at least one processor causes controller and the magnetic resonance imaging excitation and detection system to perform a series of method steps comprising:
         A) scanning the body with reverse circularly polarized non-tissue damaging RF;
         B) detecting MR signals generated by the electromagnetic coupling of the reverse circularly polarized non-tissue damaging RF with the electromagnetically coupled RF current producing objects in the body
         C) using the detected MR signals in order to determine a risk value to the body, derived from the electromagnetically coupled RF current that indicates the presence of dangerous magnetic field coupling; and
         D providing the risk value to a user in order to determine the prudence of performing a full MRI imaging scan, on the body.

2. A method for detecting electromagnetically coupled RF current producing objects in a body undergoing a magnetic resonance (MR) imaging prescan, as a prudent safety measure before performing a full MRI imaging scan comprising:
   A) scanning the body with reverse circularly polarized non-tissue damaging RF;
   B) detecting MR signals generated by the electromagnetic coupling of the reverse circularly polarized non-tissue damaging RF with the electromagnetically coupled RF current producing objects in the body;

C) using the detected MR signals to determine a risk value to the body, derived from the electromagnetically coupled RF current that indicates the presence of dangerous magnetic field coupling; and D) providing the risk value to a user in order to determine the prudence of performing a full MRI imaging scan, on the body.

3. The method, as recited in claim 2, wherein the detected MR signals are received non-tissue damaging reverse circularly polarized RF signals.

4. The method, as recited in claim 3, wherein the MR signals have an amplitude intensity and a phase shift, wherein the using of the detected MRI signals uses the intensity and/or phase of the detected MR signals in order to determine the risk value.

5. The method as recited in claim 4, wherein a series of one or more images are post- processed from the detected MR signals in order to compute physical quantities and in order to determine the risk value.

6. The method, as recited in claim 4, further comprising tuning the reverse circularly polarized non-tissue damaging RF to the body so that the reverse circularly polarized non-tissue damaging RF is perfectly reversed for the body undergoing the magnetic resonance (MR) imaging prescan.

7. The method, as recited in claim 6, further comprising-generating a reverse circularly polarized image of the body; and displaying or printing the reverse circularly polarized image of the body.

8. The method, as recited in claim 6, wherein the tuning the reverse circularly polarized non-tissue damaging RF to the body uses RF current sensors, or directional power sensors in order to perform said tuning.

9. The method, as recited in claim 6, further comprising tuning the reverse circularly polarized non-tissue damaging RF to the body so the reverse circularly polarized RF is no more than 20% from perfectly reversed for the body.

10. The method, as recited in claim 6, wherein the scanning of the body with reverse circularly polarized non-tissue damaging RF, scans, in a single scan, a volume with a thickness greater than 20 cm., from which the MR signals are detected.

11. The method, as recited in claim 2, wherein the detected MR signals are received reverse circularly polarized non-tissue damaging RF signals.

12. The method, as recited in claim 2, further comprising tuning the reverse circularly polarized non-tissue damaging RF to the body so the reverse circularly polarized non-tissue damaging RF is perfectly reversed for the body undergoing the magnetic resonance (MR) imaging prescan.

13. The method, as recited in claim 2, further comprising generating a $B_1$ magnetic field map from the detected MR signals.

14. The method, as recited in claim 2, wherein the scanning of the body with reverse circularly polarized non-tissue damaging RF, scans, in a single scan, a volume with a thickness greater than 20 cm., from which the MR signals are detected.

15. A method for detecting electromagnetically coupled RF current producing objects in a body undergoing a magnetic resonance (MR) imaging prescan, as a prudent safety measure before performing a full MRI imaging scan comprising:

a) scanning the body with non-tissue damaging reverse circularly polarized RF;

b) detecting MR signals in the body generated by the electromagnetic coupling with the reverse circularly polarized non-tissue damaging RF and c) using intensities of the detected MR signals in order to determine a risk value to the body derived from the induced electromagnetically coupled RF current that indicates the presence of a dangerous B1 magnetic field coupling because of the risk of tissue heating due to coupling; and providing the risk value to a user in order to determine the prudence of performing a full MRI imaging scan, on the body.

16. The method, as recited in claim 15, further comprising tuning the reverse circularly polarized non-tissue damaging RF to the body so the reverse circularly polarized RF is no more than 20% from perfectly reversed for the body and scanning the body with the tuned reverse circular polarized non-tissue damaging RF.

17. The method, as recited in claim 16, wherein the scanning of the body with reverse circularly polarized non-tissue damaging RF, scans, in a single scan, a volume with a thickness greater than 20 cm., from which the MR signals are detected.

* * * * *

UNITED STATES PATENT AND TRADEMARK OFFICE
CERTIFICATE OF CORRECTION

PATENT NO.         : 8,294,461 B2
APPLICATION NO.    : 12/354451
DATED              : October 23, 2012
INVENTOR(S)        : Overall et al.

It is certified that error appears in the above-identified patent and that said Letters Patent is hereby corrected as shown below:

In the Specification Under Column 1:

• Please replace Column 1, line no. 6-10 with:

-- FEDERALLY-SPONSORED RESEARCH OR DEVELOPMENT
This invention was made with Government support under contract EB008108 awarded by the National Institutes of Health. The Government has certain rights in this invention. --

Signed and Sealed this
Twenty-sixth Day of March, 2013

Teresa Stanek Rea
*Acting Director of the United States Patent and Trademark Office*